US012672534B2

(12) United States Patent
Lin et al.

(10) Patent No.: US 12,672,534 B2
(45) Date of Patent: Jun. 30, 2026

(54) COMPLEMENTARY FIELD EFFECT TRANSISTOR

(71) Applicant: Taiwan Semiconductor Manufacturing Company, Ltd., Hsinchu (TW)

(72) Inventors: Chun-Yen Lin, Hsinchu (TW); Shih-Wei Peng, Hsinchu (TW); Wei-Cheng Lin, Hsinchu (TW); Jiann-Tyng Tzeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 406 days.

(21) Appl. No.: 18/516,079

(22) Filed: Nov. 21, 2023

(65) Prior Publication Data

US 2024/0395667 A1 Nov. 28, 2024

Related U.S. Application Data

(60) Provisional application No. 63/504,139, filed on May 24, 2023.

(51) Int. Cl.
*H10D 30/01* (2025.01)
*H10D 30/43* (2025.01)
(Continued)

(52) U.S. Cl.
CPC .......... *H10W 20/20* (2026.01); *H10D 30/014* (2025.01); *H10D 30/43* (2025.01); *H10D 30/6735* (2025.01); *H10D 30/6757* (2025.01); *H10D 62/121* (2025.01); *H10D 84/0167*

(2025.01); *H10D 84/0186* (2025.01); *H10D 84/038* (2025.01); *H10D 84/85* (2025.01)

(58) Field of Classification Search
None
See application file for complete search history.

(56) References Cited

U.S. PATENT DOCUMENTS

2008/0054313 A1 3/2008 Dyer et al.
2017/0117291 A1* 4/2017 Or-Bach ............... H10B 43/27
(Continued)

FOREIGN PATENT DOCUMENTS

TW 202143392 A 11/2021

*Primary Examiner* — Kyoung Lee
(74) *Attorney, Agent, or Firm* — Merchant & Gould P.C.

(57) ABSTRACT

An IC device in some embodiments includes a first conductive line in a first conductive layer disposed in a first plane, a second conductive line in a second conductive player disposed in a second plane, and a conductor connecting first and second conductive lines, the conductor including a conductive wall disposed in a plane substantially transverse to the first plane and have a length in a direction substantially parallel to the first plane and a height in a direction substantially transverse to the first plane. The conductive wall in some embodiments includes a conductive plate electrically interconnecting two metal diffusion regions each of which electrically connected to a respective one of the first and second conductive lines. The conductive wall in other embodiments includes two metal diffusion regions abutting each other, each of the metal diffusion regions electrically connected to a respective one of the first and second conductive lines.

20 Claims, 9 Drawing Sheets

(51) Int. Cl.

| | |
|---|---|
| *H10D 30/67* | (2025.01) |
| *H10D 62/10* | (2025.01) |
| *H10D 84/01* | (2025.01) |
| *H10D 84/03* | (2025.01) |
| *H10D 84/85* | (2025.01) |
| *H10W 20/20* | (2026.01) |

(56) References Cited

U.S. PATENT DOCUMENTS

| | | | |
|---|---|---|---|
| 2021/0305252 | A1 | 9/2021 | Chiang et al. |
| 2021/0320052 | A1 | 10/2021 | Kao et al. |
| 2022/0375860 | A1 | 11/2022 | Huang et al. |
| 2022/0384311 | A1 | 12/2022 | Oh et al. |

* cited by examiner

500

Back Side (top view):

Front Side (top view):

| # | Description | Formula |
|---|---|---|
| A | Dummy Device | 1CPP |
| B | CMG-CPODE Space | 0.25~0.5CPP |
| C | CMG-VLI Enclosure | 0.5~0.75CPP |
| D | Vertical strap VLI Width | 1~2CPP |
| E | Min Cell Pitch (A+B+C+D) | 4~5CPP |
| E | Sheet Height | 1Sheet |
| F | EPI Isolation | 1~2 Sheet Height |
| | Depth of Strap VLI (E+F) | 3~4 Sheet Height |

B + C ≈ 1 CPP

| # | Description | Formula |
|---|---|---|
| A | Dummy Device | 1CPP |
| B | CMG-CPODE Space | 0.25~0.5CPP |
| C | CMG-VLI Enclosure | 0.5~0.75CPP |
| D | Vertical strap VLI Width | 1~2CPP |
| E | Min Cell Pitch (A+B+C+D) | 4~5CPP |
| F | Sheet Height | 1Sheet |
|   | EPI Isolation | 1~2 Sheet Height |
|   | Depth of Strap VLI (E+F) | 3~4 Sheet Height |

COMPLEMENTARY FIELD EFFECT TRANSISTOR

CROSS-REFERENCE TO RELATED APPLICATIONS

This application claims the benefit of U.S. Provisional Patent Application No. 63/504,139 titled "COMPLEMENTARY FIELD EFFECT TRANSISTOR" and filed 24 May 2023, which provisional application is incorporated herein by reference in its entirety.

BACKGROUND

As the semiconductor industry constantly strives for higher device density, higher performance, and lower costs, challenges from both fabrication and design issues have resulted in the development of three-dimensional designs, such as a multi-gate field effect transistor (FET), including a FinFET and a gate-all-around (GAA) FET. In a typical FinFET, a gate electrode is adjacent to three side surfaces of a channel region with a gate dielectric layer interposed therebetween. A complementary FET (CFET) typically includes a bottom FET disposed over a substrate and a top FET disposed above the bottom FET. A gate structure including a gate dielectric layer and a gate electrode layer is commonly formed around the channel region of the bottom and top FETs. Typically, the bottom FET is a first conductivity type (e.g., n-type) FET and the top FET is a second conductivity type (e.g., p-type) different from the first conductivity type, or vice versa.

Stacking the n-type and p-type devices in this manner can scale the cell area by as much as 50%. Generally, the interconnection of n-type and p-type devices will be in the vertical (z-axis) dimension. Structures with backside routing and/or power rails can facilitate such interconnections.

With such a backside power rail, power distribution is made from the backside of the device. Power tap cells connect backside power to top of the device. In some examples, nanosheet power tap cells connect VSS/VDD power rails from the backside (B/S) to the frontside (F/S) of the device. CFET power tap cells may only connect one of VSS and VDD from B/S to F/S in some configurations. Structures for connecting power from B/S to F/S can have significant via resistance and/or area penalties. Efforts are ongoing to design integrated circuit devices, including devices having CFETs, with low via resistance and/or area penalties.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
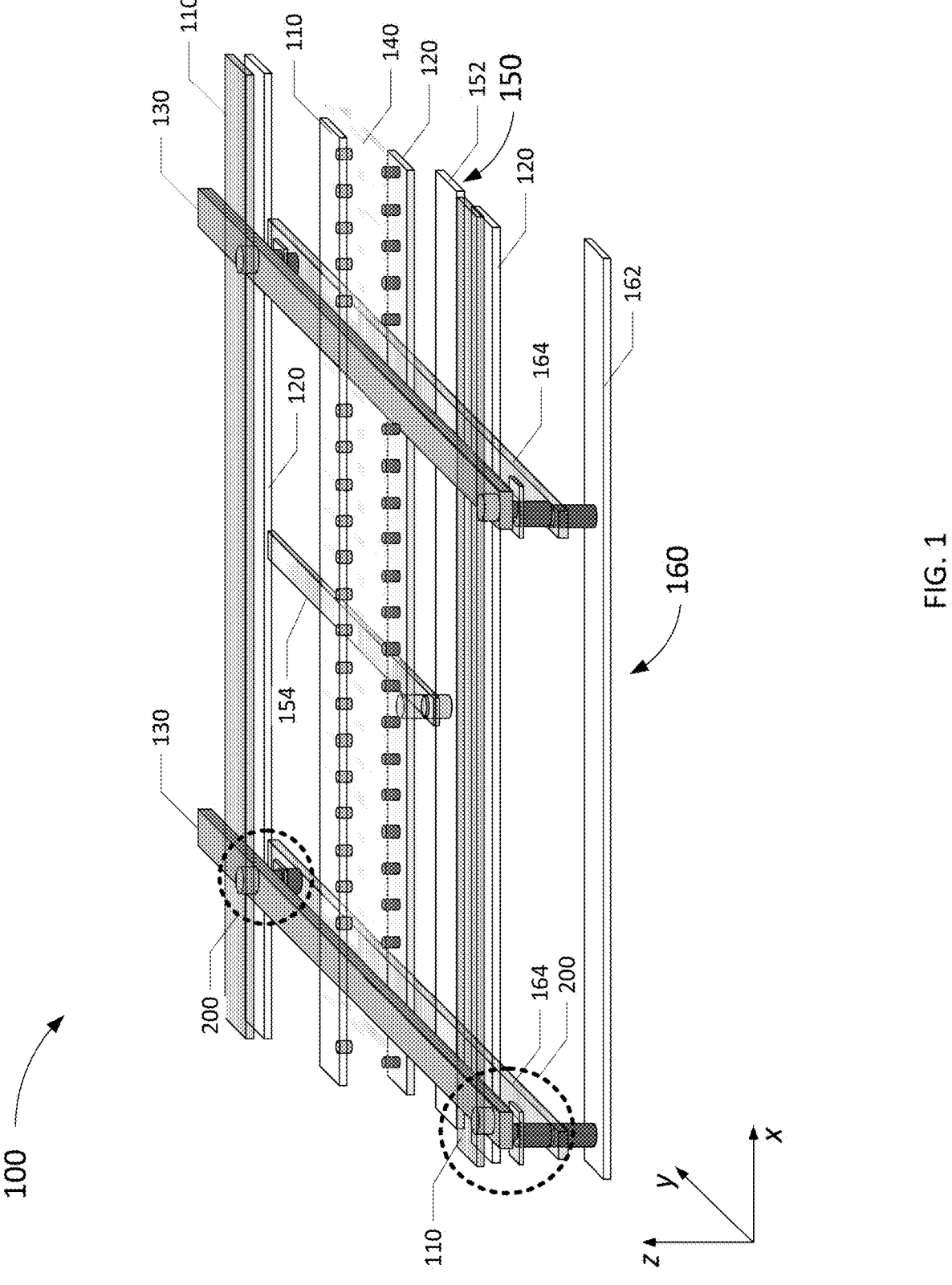
FIG. 1 is a schematic illustration of an example device including CFETs and vertical strap connections for power tap cells, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure relates to power distribution in integrated circuits (ICs), more specifically to supplying power across layers of an IC, e.g., from a power grid (PG) on the B/S to the F/S. Conventional designs of power supply structures include power tap cells that employ localized feedthrough structures. For instance, power tap designs in nanosheet structures may include an express via (EV) and a feed though via (FTV); power tap design in CFET may include vertical local interconnects (VLIs), in some cases imbedded in common gates (CMGs). Such structures need an empty area for connection, which can impact scaling of cell height or result in high power loss.

Certain embodiments disclosed herein employ elongated VLIs in directions substantially parallel to the conductive layers, such as M0, such that power can be routed to the conductive layer (e.g., M0) closest to the active devices in the IC without passing through a F/S power distribution network layer (e.g., M1). With some disclosed examples, a vertical local interconnect (VLI) structure is aligned with the device power-grid (PG) arrangement, such as a VSS line in BM0 in the B/S, thus creating a vertical strap connection for the power tap cell. This results in a vertical strap VLI power strap that is parallel to the VSS power rail, providing a larger contact area and lower via resistance, Rc, to reduce power loss.

In some embodiments, power is transmitted from the B/S through the VLI strap to the F/S (e.g. M0 metal layer for power) without affecting M0 lines used for signals, which are electrically isolated from the power distribution lines. For example, each cell may have one M0 for power and two M0 for signals. In some embodiments, two or more cells can be arranged along the direction in which the VLI extends.

To address issues associated with common gates (CMG) on an active area or oxide diffusion (OD) area, the entire strap CMG/VLI/MD/BMD are formed as a power tap connection that is aligned with the PG arrangement. As such, the VLI is embedded within the CMG. The CMG does not overlap with the active area, but rather is separated from the active area. Dummy OD ("DMY OD") areas are provided on both sides of the CMG as a buffer to prevent the VLI from affecting other devices.

Disclosed examples of the power tap cell structure use the dummy device to prevent abutment device layout effects. In some examples, the power tap cell width is 4 to 5 contact poly pitch (CPP), and the CPP is about 40 to 60 nm. The strap VLI depth is 3 to 4 sheets high, and sheet height is about 10 to 25 nm.

In some embodiments, a vertical strap metal diffusion (MD) and back metal diffusion (BMD) are used to deliver power. Such vertical strap is also parallel to the VSS power rail. In other words, the MD and BMD are combined to form a strap MD+BMD, replacing the VLI. The strap MD+BMD has an extending direction vertical to that of M0/BM0.

Figure 2:
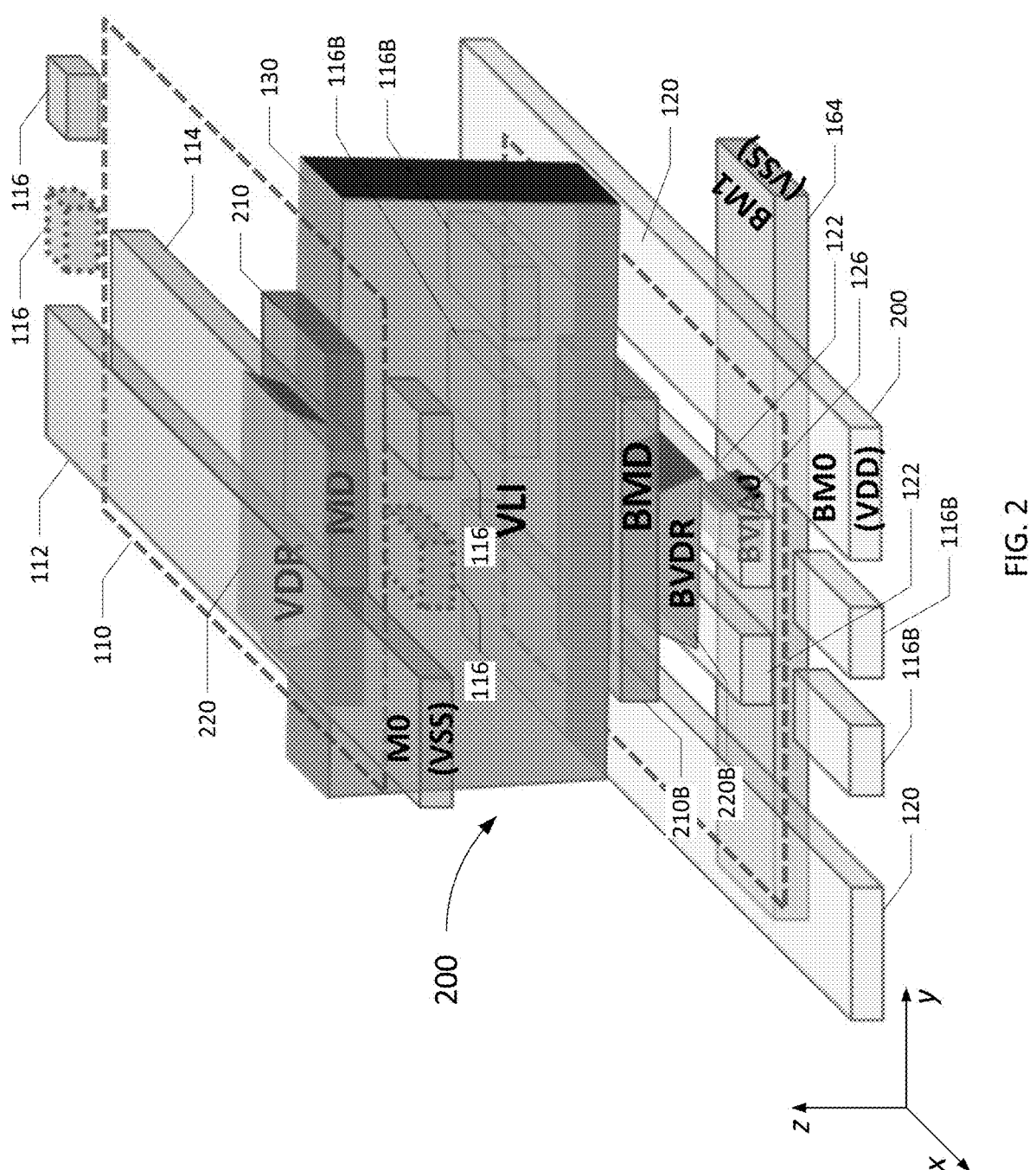
FIG. 2 is a schematic illustration of a power tap cell in the device illustrated in FIG. 1, in accordance with some embodiments.
Figure 3:
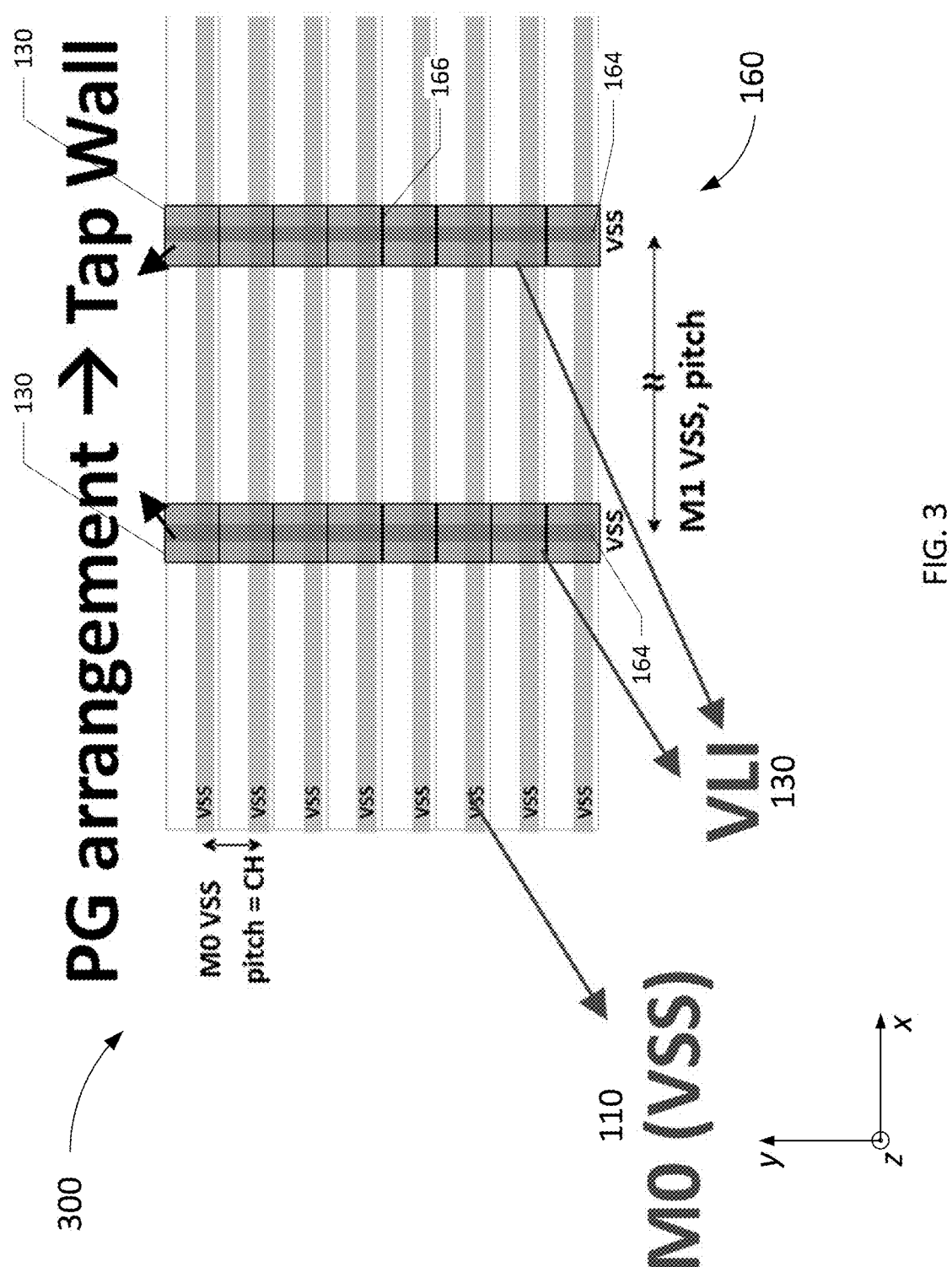
FIG. 3 is a schematic illustration of a power grid arrangement including polar strap structures, in accordance with some embodiments.

An example IC device 100 according to some embodiments is schematically illustrated in FIGS. 1, 2, and 3. The device 100 in this example includes conductive segments 110 in a first F/S conductive layer, in this example M0, conductive segments 120 in a first B/S conductive layer BM0, in this example 120, and VLI power straps 130. The device 100 further includes one or more semiconductor devices, such as CFETs 140 connected between at least one segment 110 of the first F/S conductive layer (M0) and at least one segment 120 of the first B/S conductive layer (BM0).

The device 100 in this example further includes a B/S power distribution network (PDN), including a first power rail network 150 and a second power rail network 160. The first power rail network 150 in this example supplies a positive rail voltage, VDD, to one or more of the segments 120 in the first B/S conductive layer (BM0) through conductive lines 152, 154 and associated conductive pillars (vias); the second power rail network 160 in this example supplies a negative rail voltage, VSS, to one or more of the segments 110 in the first F/S conductive layer (M0) through conductive lines 162, 164, portions of intervening conductive layer(s) (in this example, patches 122 (as well as patches 116B for adjacent cells) of BM0 (FIG. 2)), one or more VLI power strap structures (power tap cells) 200, and associated conductive pillars (vias). The semiconductor devices 140 in this example are connected between a VDD line in BM0 and a VSS line in M0.

Referring more specifically to FIG. 2, a VLI power strap structure in this example includes a VLI power strap 130, which is shaped as a long vertical (i.e., substantially perpendicular to the conductive layers M0 and BM0) wall (or plate) extending horizontally in parallel with a conductive line in one of the power rail networks. In some embodiments, a VLI power strap structure 130 extends substantially the entire length of the power tap cell 200 in the direction of the lateral length of the VLI strap 130 (i.e., the y-direction); in some embodiments, a VLI power strap 130 extends a fraction of the length of the cell 200; for example, the lateral length (y-direction) of the VLI power strap 130 is between about 50% to about 75% of the length of the power tap cell 200. In some embodiments, the lateral length (y-direction) of the VLI power strap 130 is at least about the width of a segment of the conductive segment 110 in the power tap cell 200. In this example, the VLI strap 130 has a length that is greater than the combined widths of the connecting portion 112 and jog portion 114 of the conductive segment 110 in FIG. 2. In other embodiments, a VLI power strap structure 130 extends through multiple cells. In this example, the VLI power strap 130 is parallel to a VSS line 164 in the BM1 layer, and both extend in the direction labeled "y" in FIG. 2. The VSS line 164 in this example is connected to conductive patches 122 in the B/S conductive layer BM0 through one or more conductive pillars, or vias (BVIA0) 126, which is in turn connected to a B/S metal diffusion (MD) layer (BMD) 210B through a B/S conductive path, such as a B/S via rail (VDR) (BVDR) 220B. A VDR in this example connects multiple conductive patches to the BMD 210B.

Similarly, from the F/S, the VLI power strap structure 200 includes conductive segment(s) 110 in the first F/S conductive layer, in this example M0. In this example, conductive segment 110 includes a connector portion 112 for supplying VSS power to other portions (e.g., semiconductor devices 140) of the IC device, and a jog portion 114, which in this example provides an eye enlarged conductive contact area. The conductive segment 110 is connected to a F/S metal diffusion (MD) layer (MD) 210 through a F/S conductive path, such as a F/S via rail (VDR) 220.

In this example, the VLI power strap 130 is connected at its top and bottom surfaces to the MD and BMD, respectively. Due to the long-will structure of the VLI power straps 130, large contact areas with MD and BMD are established, resulting in reduced overall resistance and attendant power loss.

Figure 4:
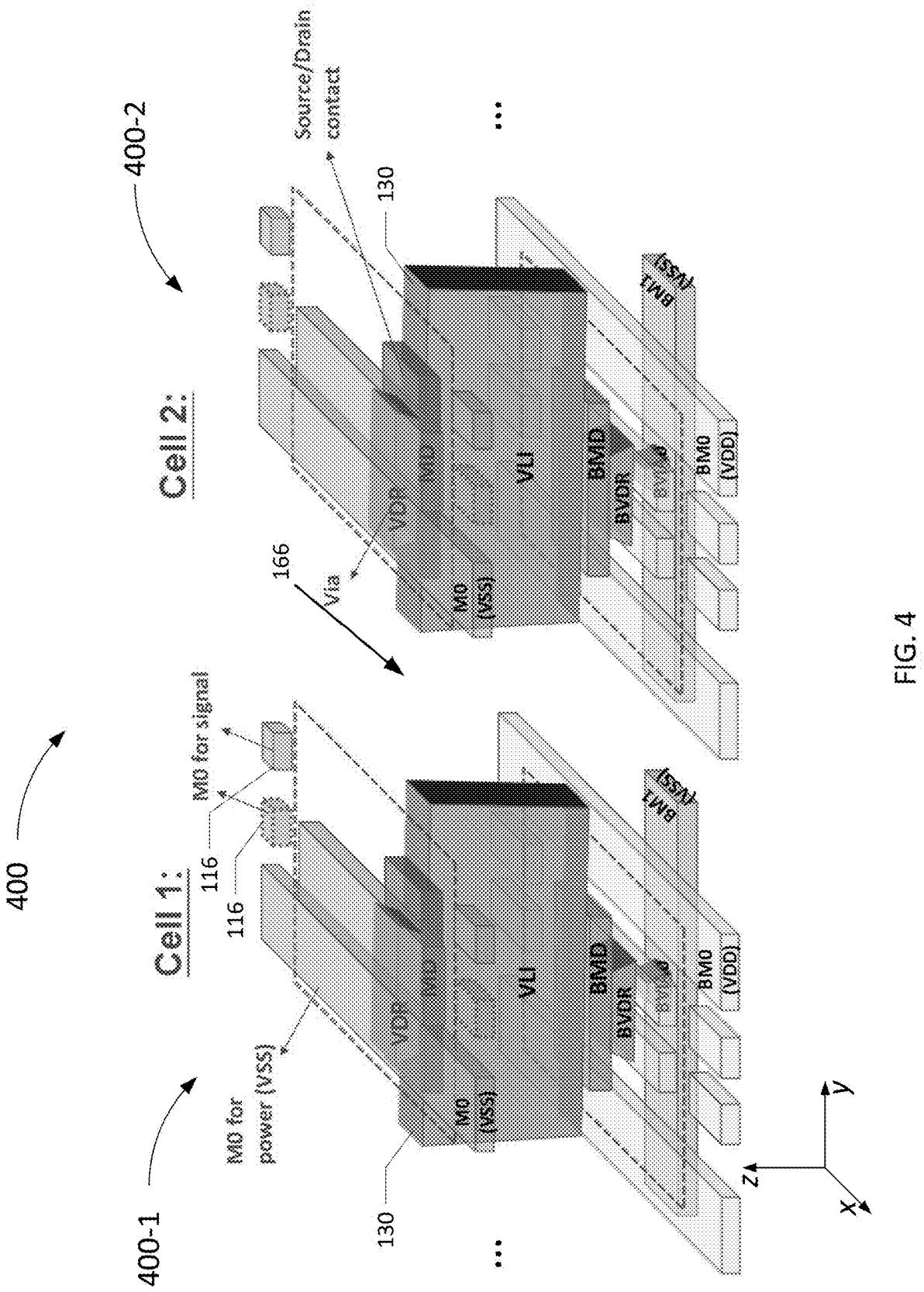
FIG. 4 is a schematic illustration of multiple power tap cells arranged in an array along the direction of the vertical strap VLI power strap, in accordance with some embodiments.

In some embodiments, as shown in FIGS. 2 and 4, each conductive layer such as the first F/S conductive layer (M0) and first B/S conductive layer (BM0), can include both conductive segments (e.g., conductive settlements 110 in M0) for power transmission and conductive segments (e.g., conductive settlements 116 in M0) for signal transmission. The power transmission segments 110 and signal transmission segments 116 are isolated from each other. In the example shown FIGS. 2 and 4, each unit cell has one power line 110 and two signal line 160.

In some embodiments, as shown by the example device 300 depicted in FIG. 3, multiple F/S power rail lines (e.g., VSS lines M0) can be connected to B/S power lines (e.g., VSS line 164) using one or more power strapped walls, such as VLI power straps 130. In this example, VSS voltage is applied from the BM1 layer to the M0 layer by VLI walls 130 aligned with the VSS line 164 in BM1. Each VLI wall can be divided into multiple segments with neighboring segments insulated from each other by a gap or insulation layer 166. Although each VLI wall 130 is illustrated in FIG. 3 as being divided into segments each of which connects the VSS line in BM1 to a respective VSS line in M0, each segment of a VLI wall can be of other lengths depending on the circuit design. For example, a segment of a VLI wall can be multiple cells in line, i.e., connected to multiple VSS lines in M0.

As another example, illustrated in FIG. 4, an IC device 400 includes multiple VLI power strap structures 400-1, 400-2, . . . , one for each cell. In this example, the cells are arranged sequentially in the direction (y) of the VSS line and BM1, and the VLI power straps 130 extend along the same line, similar to the configuration shown in FIG. 3. Each of the VLI power strap structures 400-1, 400-2, . . . in this example is similar to the VLI power strap structure 200 illustrated in FIG. 2, but can have other suitable structures.

Figure 5B:
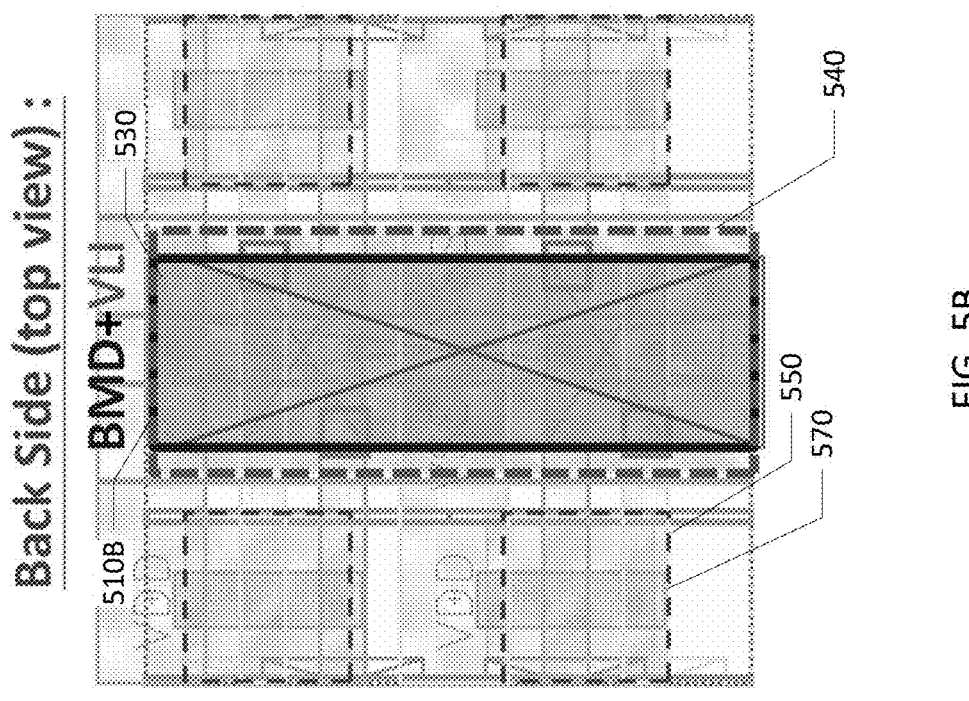
FIGS. 5A and 5B shows schematically the front side and back side, respectively, of a power tap cell, in accordance with some embodiments.
Figure 5A:
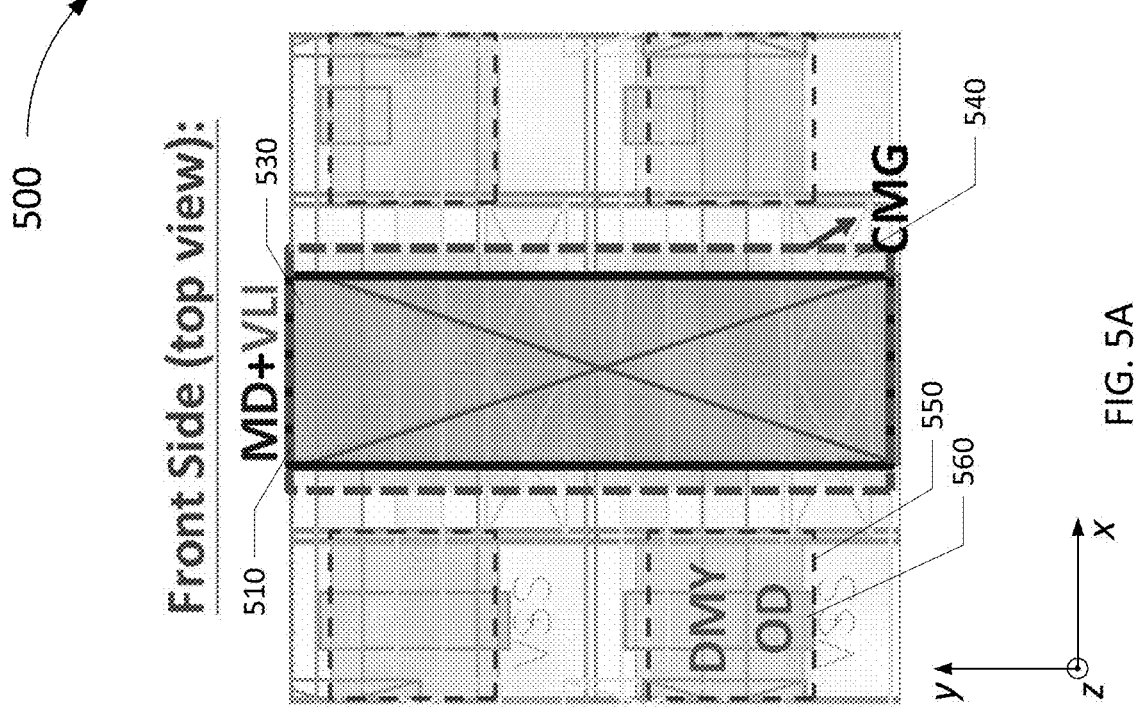

In some embodiments, such as the example illustrated in FIGS. 5A and 5B, a power strap structure, such as a VLI power strap structure described above, dummy oxide diffusion regions (DMY OD) are provided on both sides of the power strap structure to isolate the structure from the power strap structure from adversely affecting other devices, such as active semiconductor devices, including CFETs. In this example, a device 500 includes a VLI power strap 530 connected between MD 510 in the BMD 510B. The device 500 further includes a common gate (CMG) 540. The VLI power strap 530, MD 510, and BMD 510B in this example are embedded within the CMG 540. The device 500 further includes DMY ODs 550 on both sides of the power strap wall (in the x-direction) and each disposed directly between a respective pair of VSS 560 and VDD 570 lines. In some embodiments, the MD/BMD/VLI/CMG structure are separated into segments, similar to the configuration illustrated in FIGS. 3 and 4.

Figure 6:
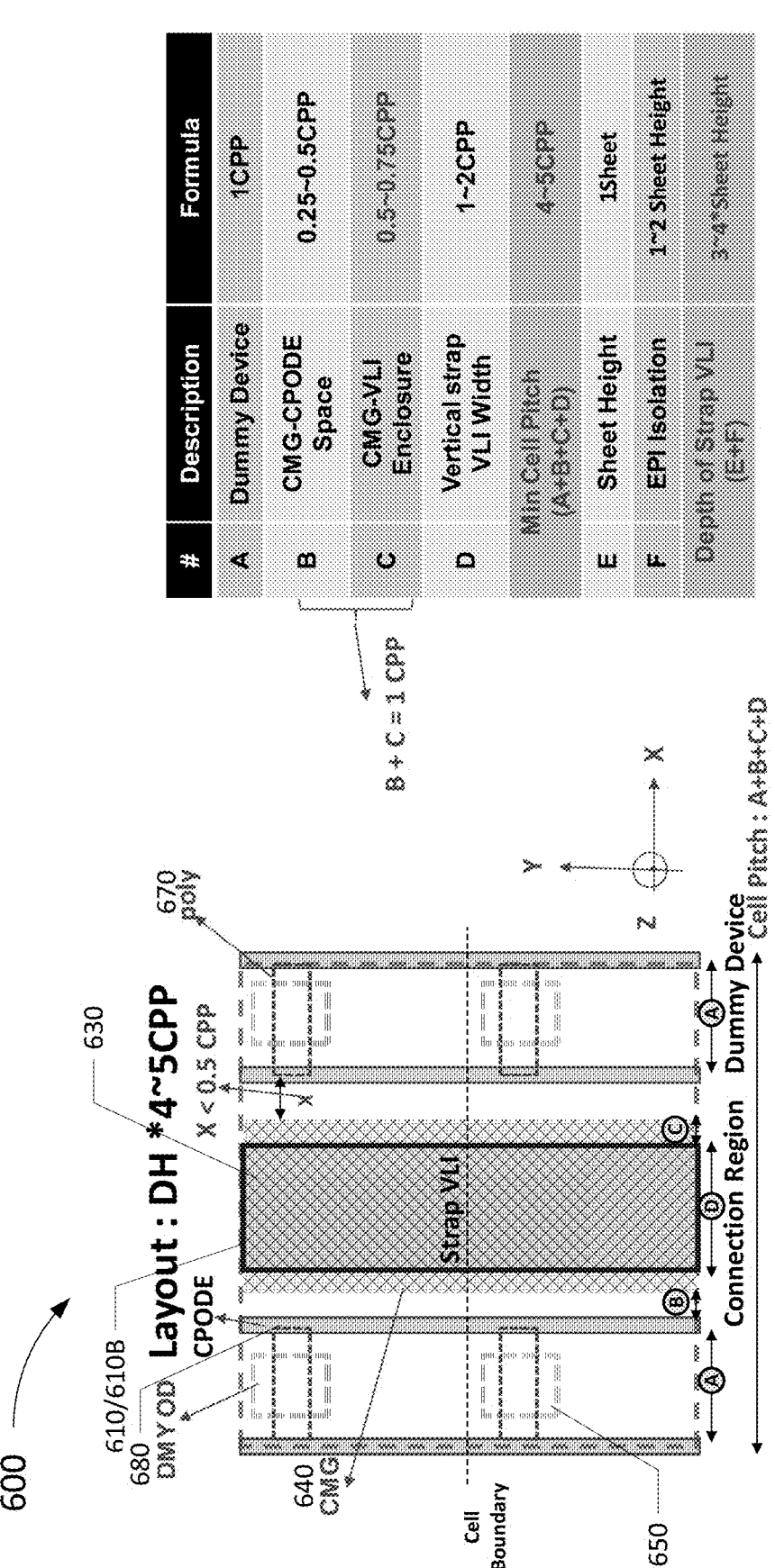
FIG. 6 schematically shows a top view of a power tap cell, including a power strap embedded within common gate (CMG), separated from dummy oxide diffusion various, in accordance with some embodiments.
Figure 7:
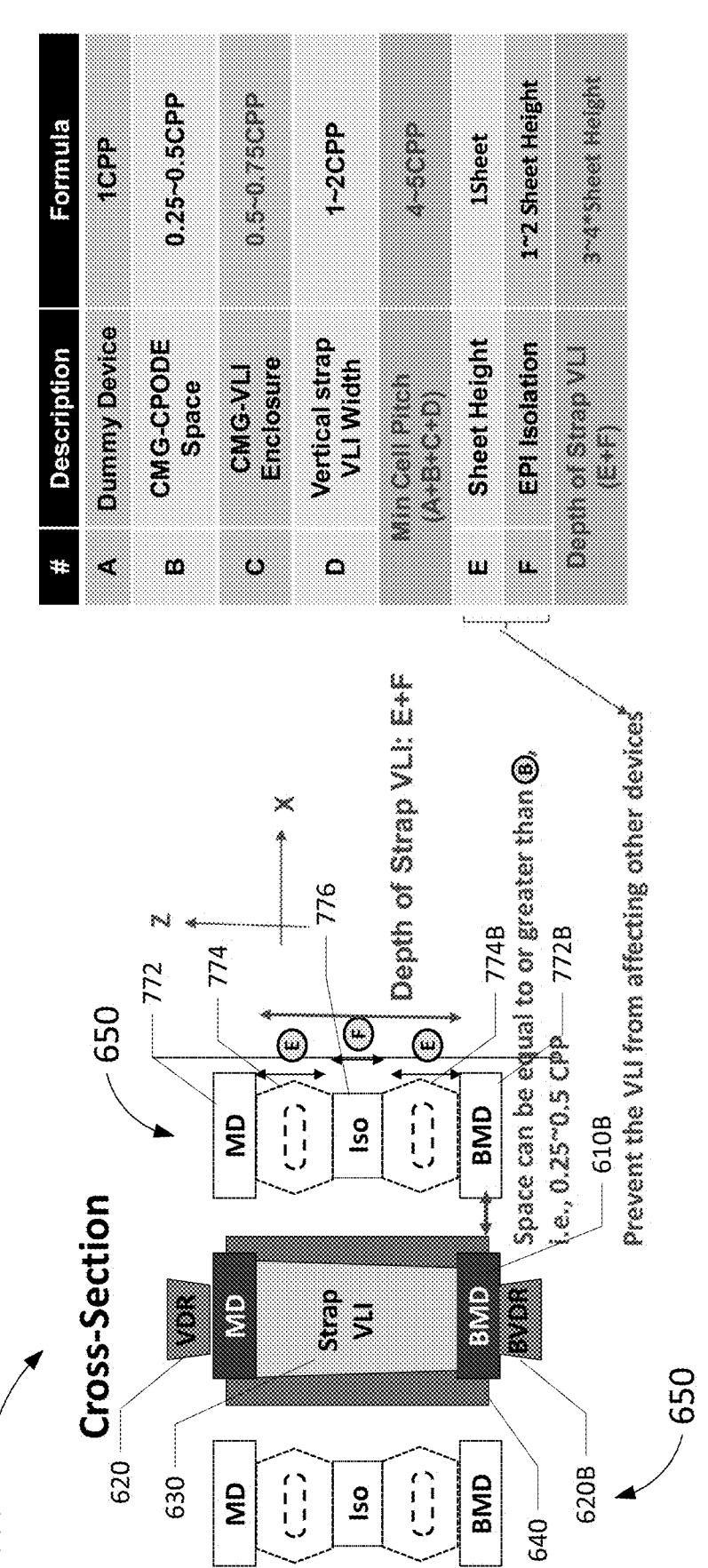
FIG. 7 schematically shows a side view, along a power strap, of the power tap cell shown in FIG. 6.

In some embodiments, such as the example illustrated in FIGS. 6 and 7, the power strap structure, or power tap cell is sized and configured to minimize or prevent adverse effect on other devices in the IC. The power tap cell 600 in this example has a structure similar to that 500 illustrated in FIGS. 5A and 5B and includes a MD 610/VLI 630/BMD 610 B structure (power strap structure) embedded within a CMG 640, DMY OD 650 on both sides (x-direction) of the power strap structure. A VDR 620 and BVDR 620B are connected to the MD 610, BMD 610B, respectively and the top and bottom ends of the power strap structure. Each DMY OD 650 in this example is protected on both sides (x-direction) by isolation layers, such as continuous poly on oxide definition edge, or a continuous poly on oxide diffusion edge, (CPODE) structures 680, which is an isolation structure that separates multiple active regions (i.e., oxide definition regions) by transforming a dummy structure that crosses the active regions into the isolation structure. Each DMY OD 650 in this example, includes an MD 772, BMD 772B, and the VLI strap 630, which includes a top epitaxial region (EPI) 774 connected to MD 772, bottom EPI 774B connected to BMD 772B and EPI isolation region 776 isolating the EPIs.

In some embodiments, the power tap cell 600 has a minimum cell pitch (DH) of 4 to 5 contact poly pitch (CPP), which is made up of (all in the x-direction) 2×(A) the width, 2×(B) the CPODE-CMG spacing, 2×(C) the thickness of the CMG-VLI enclosure, and (D) the VLI strap width. In some embodiments, such as those illustrated in FIGS. 6 and 7, A is approximately 1 CPP; B 0.25 to 0.5 CPP; C 0.5 to 0.75 CPP and D 1 to 2 CPP. In this example, the CPP is about 40 to 60 nm. In this example, the strap VLI depth is 3 to 4 sheets high, which includes 2×(E) the height of the EPIs 774,774B; and (F) the height of the EPI isolation. In some embodiments, such as those illustrated in FIGS. 6 and 7, E is approximately 1 sheet height; and F 1 to 2 sheet heights. In this example, the sheet height is about 10 to 25 nm.

Figures 8A, 8B:
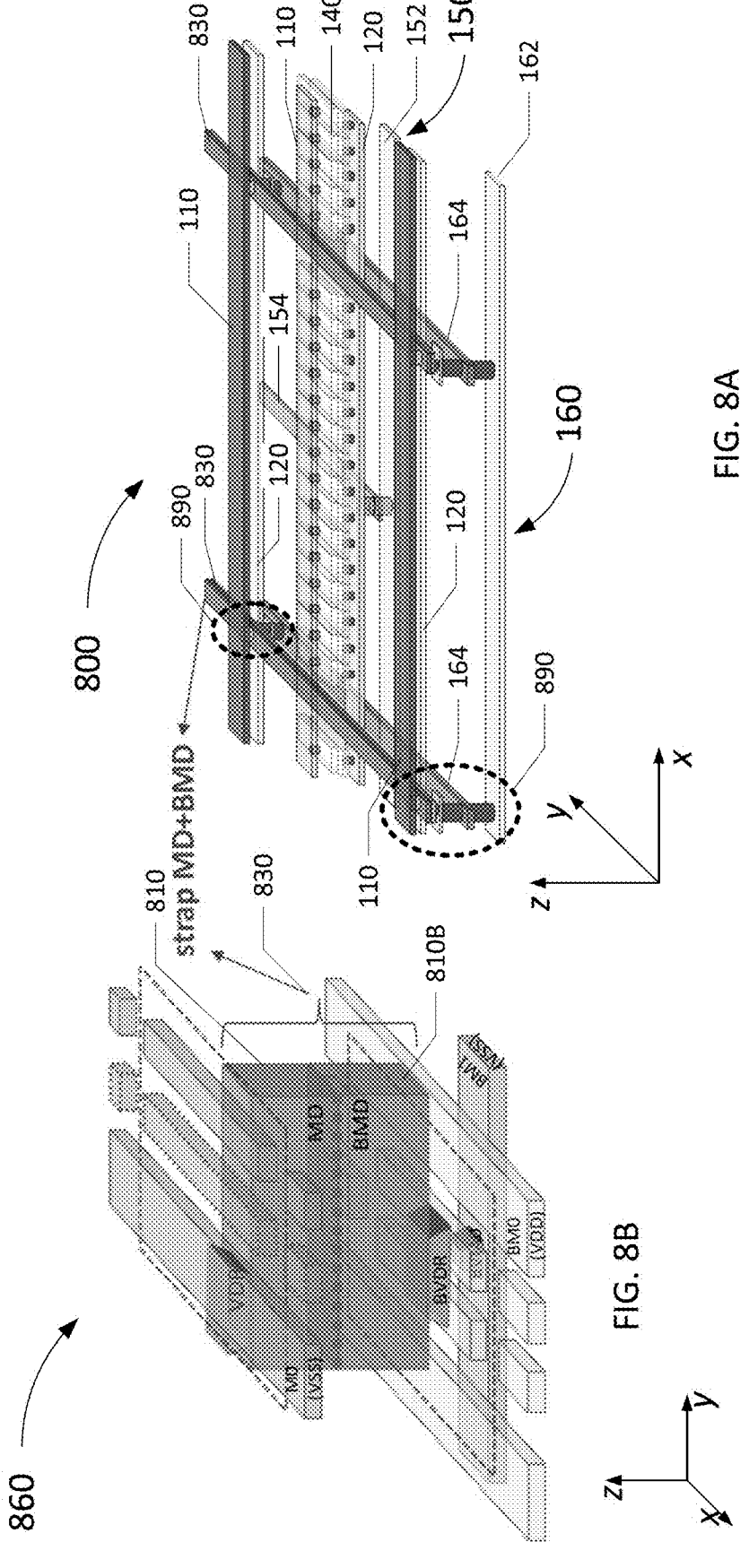
FIG. 8A is a schematic illustration of an example device including CFETs and vertical straps metals diffusion layers instead of VLIs, in accordance with some embodiments.
FIG. 8B is a schematic illustration of a power tap cell in the device illustrated in FIG. 8A, in accordance with some embodiments.

In some embodiments, such as the example illustrated in FIGS. 8A and 8B, the device 800, including the power tap cell 890, is similar to the device 100 depicted in FIGS. 1 and 2, except that the VLI power straps 130 is replaced by a MD+BMD strap 830, which is a combination of MD 810 and BMD 810B abutting each other.

Figure 9:
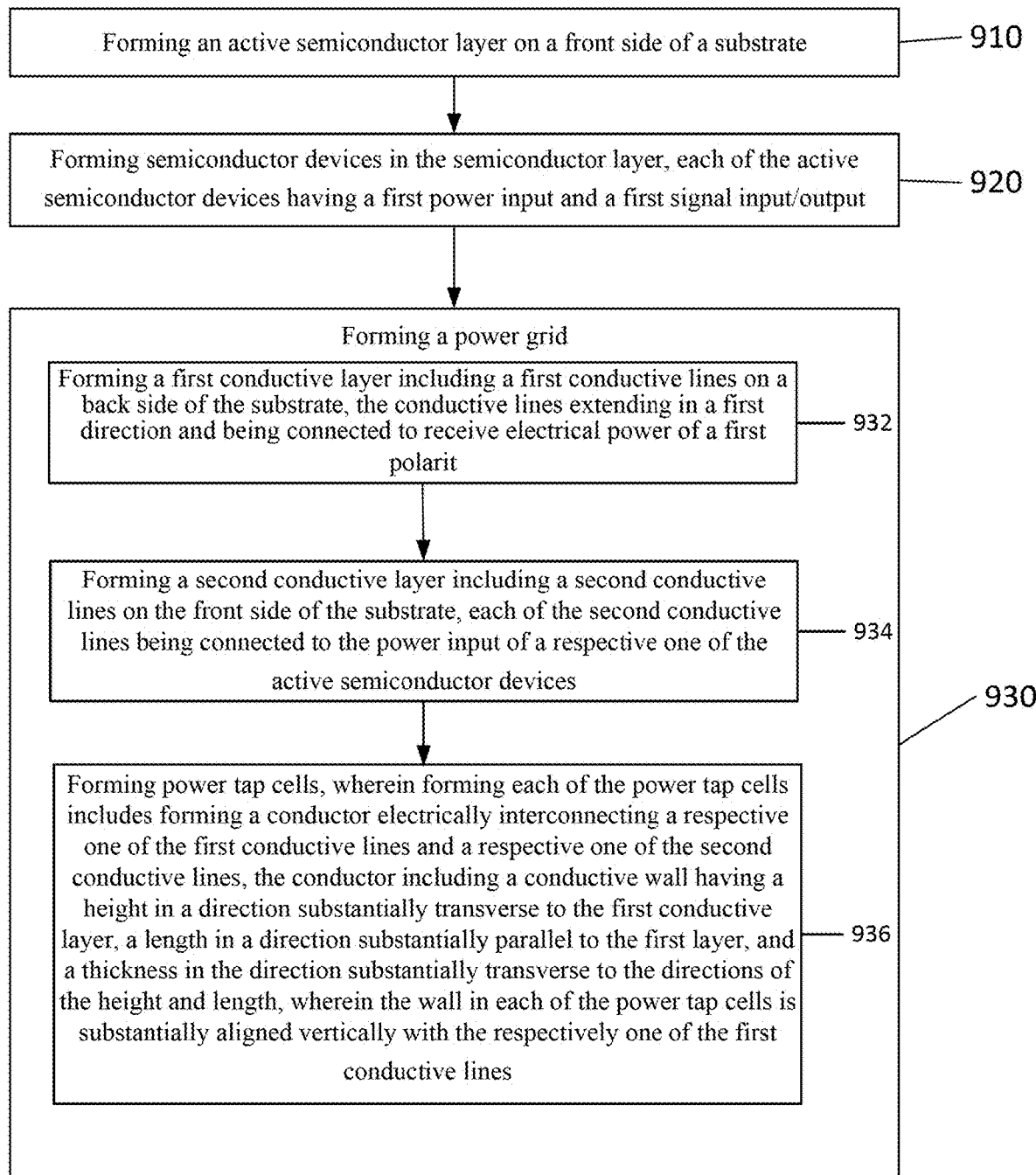
FIG. 9 outlines an example method of making a device including CFETs and vertical strap connections for power tap cells, in accordance with some embodiments.

In some embodiments, such as the example outlined in FIG. 9, a method 900 of making an integrated circuit device includes: forming 910 an active semiconductor layer on a front side of a substrate; forming 920 multiple active semiconductor devices in the semiconductor layer, each of the active semiconductor devices having a first power input and a first signal input/output; and forming 930 a power grid. The step of forming the power grid includes: forming 932 a first conductive layer having a first set of conductive lines on a back side of the substrate, the conductive lines extending in a first direction and being connected to receive electrical power of a first polarity; forming 934 a second conductive layer having a second set of conductive lines on the front side of the substrate, each of the second set of conductive lines being connected to the power input of a respective one of the active semiconductor devices; and forming 936 a set of power tap cells. The forming each of the set of power tap cells includes forming a conductor electrically interconnecting a respective one of the first set of conductive lines and a respective one of the second set of conductive lines. The conductor includes a conductive wall having a height in a direction substantially transverse to the first conductive layer, a length in a direction substantially parallel to the first conductive layer, and a thickness in the direction substantially transverse to the directions of the height and length. The wall in each of the power tap cells is substantially aligned vertically with the respectively one of the first set of conductive lines.

Thus, by using a strap VLI or strap MD+BMD, power transmission from B/S to F/S for semiconductor devices such as CFET need not pass through the M1 metal layer, and M1 layer therefore is not required to electrically connect to the VSS rail. Further the vertical wall structure of the VLI or MD+BMD strap provide large contact area. These features offer a decreasing resistance in the power distribution network. In some examples, resistance is reduced to 0.3-0.4 times that of conventional VLI structures.

According to an aspect of the present disclosure, a semiconductor device includes a first metal layer disposed substantially in a first plane; a second metal layer disposed substantially in a second plane above the first plane; and a power tap cell comprising a conductor electrically interconnecting the first and second metal layers. The conductor includes a conductive wall having a height in a direction substantially transverse to the first plane, a length in a direction substantially parallel to the first plane, and a thickness in the direction substantially transverse to the directions of the height and length.

According to another aspect of the present disclosure, an integrated circuit device includes a substrate having a front side and a back side; an active semiconductor layer formed on the front side of the substrate and having a set of active semiconductor devices formed in the semiconductor layer, each of the active semiconductor devices having a first power input and a first signal input/output; a power grid having a first conductive layer having a first set of conductive lines disposed on the back side of the substrate, the conductive lines extending in a first direction and being connected to receive electrical power of a first polarity; a second conductive layer having a second set of conductive lines disposed on the front side of the substrate, each of the second set of conductors being connected to the power input of a respective one of the active semiconductor devices; and multiple power tap cells, each including a conductor electrically interconnecting a respective one of the first set of conductive lines and a respective one of the second set of conductive lines, the conductor including a conductive wall having a height in a direction substantially transverse to the first conductive plane, a length in a direction substantially parallel to the first plane, and a thickness in the direction substantially transverse to the directions of the height and length, wherein the wall in each of the power tap cells is substantially aligned vertically with the respectively one of the first set of conductive lines.

According to another aspect of the present disclosure, a method of transmitting electrical power from backside of an integrated circuit device to front side includes arranging a set of power tap cells, each having a width, side-by-side along a line along the widths the cells, each cell having a conductive wall extending from backside of an integrated circuit device to front side and having a width of at least 50% of the width of the cell; connecting a power input of each one of a set of active semiconductor devices on the front side of the integrated circuit device to a first front-side conductive layer vertically closest to the active semiconductor devices; and electrically connecting the power grid on the backside of the integrated circuit to the first front-side conductive layer using the conductive walls without passing through any other front-side conductive layer.

According to another aspect of the present disclosure a method of making an integrated circuit device includes: forming an active semiconductor layer on a front side of a substrate; forming multiple active semiconductor devices in the semiconductor layer, each of the active semiconductor devices having a first power input and a first signal input/output; and forming a power grid. The step of forming the power grid includes: forming a first conductive layer having a first set of conductive lines on a back side of the substrate, the conductive lines extending in a first direction and being connected to receive electrical power of a first polarity; forming a second conductive layer having a second set of conductive lines on the front side of the substrate, each of the second set of conductive lines being connected to the power input of a respective one of the active semiconductor devices; and forming a set of power tap cells. The forming each of the set of power tap cells includes forming a conductor electrically interconnecting a respective one of the first set of conductive lines and a respective one of the second set of conductive lines. The conductor includes a conductive wall having a height in a direction substantially transverse to the first conductive layer, a length in a direction substantially parallel to the first conductive layer, and a thickness in the direction substantially transverse to the directions of the height and length. The wall in each of the power tap cells is substantially aligned vertically with the respectively one of the first set of conductive lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first metal layer disposed substantially in a first plane;
a second metal layer disposed substantially in a second plane above the first plane;
a power tap cell comprising a conductor electrically interconnecting the first and second metal layers, the conductor comprising a conductive wall having a height in a direction substantially transverse to the first plane, a length in a direction substantially parallel to the first plane, and a thickness in the direction substantially transverse to the directions of the height and length; and
an active semiconductor layer disposed substantially in a third plane substantially parallel to the first plane, the active semiconductor layer having a front side and a back side,
the first metal layer comprising a first plurality of conductive lines adapted to be connected to receive electrical power of a first polarity, and the conducting wall is vertically substantially aligned with at least a first one of the first plurality of conductive lines.

2. The semiconductor device of claim 1, wherein the conductor further comprises:
a first metal diffusion layer electrically connected to the first metal layer; and
a second metal diffusion layer electrically connected to the second metal layer,
wherein the conductive wall electrically interconnects the first and second metal diffusion layer.

3. The semiconductor device of claim 1, wherein the conductor comprises two stacked layers of metal diffusion layers.

4. The semiconductor device of claim 1, wherein:
the first metal layer is located on the back side of the active semiconductor layer; and
the second metal layer is located on the front side of the active semiconductor layer.

5. The semiconductor device of claim 4, wherein the second metal layer comprises a metal line electrically connected to the conductor, the semiconductor device further comprising an active device having a first power input connected to the conductive line in the second conductive layer.

6. The semiconductor device of claim 5, further comprising a second conductive line in the first metal layer and adapted to be connected to receive an electrical power of a second polarity, the active device having a second power input electrically connected to the second conductive line.

7. The semiconductor device of claim 6, wherein the active device comprises a complementary field-effect transistor (CFET).

8. The semiconductor device of claim 7, wherein the CFET comprises a pair of field-effect transistors (FETs) with a common gate region, wherein the conductor is embedded in the common gate region.

9. An integrated circuit device, comprising:
a substrate having a front side and a back side;
an active semiconductor layer formed on the front side of the substrate and having a plurality of active semiconductor devices formed in the active semiconductor layer, each of the active semiconductor devices having a first power input and a first signal input/output;

a power grid comprising a first conductive layer having a first plurality of conductive lines disposed on the back side of the substrate, the conductive lines extending in a first direction and being connected to receive electrical power of a first polarity;

a second conductive layer comprising a second plurality of conductive lines disposed on the front side of the substrate, each of the second plurality of conductive lines being connected to the first power input of a respective one of the active semiconductor devices; and a plurality of power tap cells, each comprising a conductor electrically interconnecting a respective one of the first plurality of conductive lines and a respective one of the second plurality of conductive lines, the conductor comprising a conductive wall having a height in a direction substantially transverse to the first conductive plane, a length in a direction substantially parallel to the first plane, and a thickness in the direction substantially transverse to the directions of the height and length, wherein the wall in each of the power tap cells is substantially aligned vertically with the respectively one of the first plurality of conductive lines.

10. The integrated circuit device of claim 9, wherein the power tap cells of plurality of the semiconductor devices are arranged side-by-side along a line substantially in vertical alignment with the first plurality of conductive lines in the first conductive layer, wherein each of the power tap cells has a width along the line, wherein the length of the conductive wall in each of the power tap cells is at least 50% of the width of the power tap cell.

11. The integrated circuit device of claim 10, wherein the second conductive layer further comprises a third plurality of conductive lines electrically isolated from the second plurality of conductive lines, and the first signal input/output of each active semiconductor devices is connected to a respective one of the third plurality of conductive lines.

12. The semiconductor device of claim 11, wherein the conductor is disposed at a lateral distance from the active device along the thickness direction, the semiconductor device further comprising a dummy active device formed in the active semiconductor layer at a location intervening the conductor and active device.

13. An integrated circuit device comprising a plurality of semiconductor devices of claim 9, wherein the power tap cells of plurality of the semiconductor devices are arranged side-by-side along a line substantially in vertical alignment with the first conductive line in the first conductive layer, wherein each of the power tap cells has a width along the line, wherein the length the conductive wall in each of the power tap cells is at least 50% of the width of the power tap cell.

14. The integrated circuit device of claim 13, wherein the length of the conductive wall in each of the power tap cells is at least 75% of the width of the power tap cell.

15. A method of making an integrated circuit device, the comprising:

forming an active semiconductor layer on a front side of a substrate;

forming a plurality of active semiconductor devices in the active semiconductor layer, each of the active semiconductor devices having a first power input and a first signal input/output; and forming a power grid, the forming step comprising:

forming a first conductive layer comprising a first plurality of conductive lines on a back side of the substrate, the first plurality of conductive lines extending in a first direction and being connected to receive electrical power of a first polarity;

forming a second conductive layer comprising a second plurality of conductive lines on the front side of the substrate, each of the second plurality of conductive lines being connected to the first power input of a respective one of the active semiconductor devices; and forming a plurality of power tap cells, wherein forming each of the plurality of power tap cells comprises forming a conductor electrically interconnecting a respective one of the first plurality of conductive lines and a respective one of the second plurality of conductive lines, the conductor comprising a conductive wall having a height in a direction substantially transverse to the first conductive layer, a length in a direction substantially parallel to the first conductive layer, and a thickness in the direction substantially transverse to the directions of the height and length, wherein the wall in each of the power tap cells is substantially aligned vertically with the respectively one of the first plurality of conductive lines.

16. The method of claim 15, further comprising arranging the power tap cells of plurality of the semiconductor devices side-by-side along a line substantially in vertical alignment with the first plurality of conductive lines in the first conductive layer, wherein each of the power tap cells has a width along the line, wherein the length the conductive wall in each of the power tap cells is at least 50% of the width of the power tap cell.

17. The method of claim 16, further comprising forming in the second conductive layer a third plurality of conductive lines electrically isolated from the second plurality of conductive lines and connecting the first signal input/output of each active semiconductor devices to a respective one of the third plurality of conductive lines.

18. The method of claim 15, wherein the forming a conductor comprises:

forming a first metal diffusion layer electrically connected to the first conductive layer; and forming a second metal diffusion layer electrically connected to the second conductive layer, wherein the conductive wall electrically interconnects the first and second metal diffusion layer.

19. The method of claim 15, wherein the forming a conductor comprises forming two stacked layers of metal diffusion layers.

20. The method of claim 15, wherein the forming a plurality of active semiconductor devices comprises forming a plurality of complementary field-effect transistor (CFET).

* * * * *